(12) United States Patent
Agrawal

(10) Patent No.: US 6,404,700 B1
(45) Date of Patent: Jun. 11, 2002

(54) LOW POWER HIGH DENSITY ASYNCHRONOUS MEMORY ARCHITECTURE

(75) Inventor: Ghasi R. Agrawal, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/880,491

(22) Filed: Jun. 13, 2001

(51) Int. Cl.[7] .................................................. G11C 8/00
(52) U.S. Cl. ...................................... 365/233; 365/203
(58) Field of Search ............................ 365/233, 230.05, 365/203, 189.03

(56) References Cited

U.S. PATENT DOCUMENTS 5,659,711 A  *  8/1997  Sugita ........................ 395/476
5,901,104 A  *  5/1999  Shinmori ................ 365/230.05
6,310,818 B1 * 10/2001  Mukai .................... 365/230.05

FOREIGN PATENT DOCUMENTS

JP        0062788    *  3/1990  .......... G11C/11/41

OTHER PUBLICATIONS

Betty Prince, "Semiconductor Memories", 1983, Wiley, 2nd pp. 326 and 327.*

* cited by examiner

Primary Examiner—M. Tran
(74) Attorney, Agent, or Firm—Suiter & Associates

(57) ABSTRACT

An architecture for a low power, high density (smaller area) asynchronous memory comprises memory cells including a forward inverter and a feedback inverter disposed in a back-to-back arrangement (i.e., back-to-back inverters), two write access transistors, a read inverter, and a read access transistor. The architecture employs a double ended write into the memory cells wherein Write Bit Lines coupled to write access transistors are precharged to Vdd–Vtn, or, alternately Vdd, when the signal Write Enable (WE) is low (i.e., "0").

48 Claims, 4 Drawing Sheets

LOW POWER HIGH DENSITY ASYNCHRONOUS MEMORY ARCHITECTURE

FIELD OF THE INVENTION

The present invention relates generally to asynchronous memory architectures, and more specifically to an architecture for a low power, high density (smaller area) asynchronous memory.

BACKGROUND OF THE INVENTION

In the past, low power asynchronous dual port memories were designed utilizing a nine transistor (9-T) core cell architecture shown in FIG. 1. In such core cells 100, the write and read were both single ended. Consequently, the value to be written to the cell 100 is driven from the Write Bitline (WBL) 102 into the cell when Write Wordline (WWL) 104 and Local Write Enable (LWEL) 112 are turned on. Similarly, when the Read Wordline (RWL) 106 is turned ON, the inverter driver 108 drives the Read Bitline (RBL) 110 either low (i.e., "0") or high (i.e., "VDD—Vtn") depending on the stored value in the cell 100.

Writing low in the 9-T core cell 100 shown in FIG. 1 may be accomplished without difficulty. However, writing high in the 9-T cell 100 is problematic since such cells 100 are very sensitive to low voltage margin To compensate for this problem, a twelve transistor (12-T) core cell architecture was developed. This architecture is illustrated in FIG. 2. In such a 12-T core cell architecture, a pseudo-double ended write is done when high (i.e., "1") is written to the cell 200. The back-to-back inverters 202 & 204 inside the cell 200 are generally skewed so that the feedback inverter 202 is slightly weaker and the forward inverter 204 is stronger.

In the architectures illustrated in FIGS. 1 and 2, the Local Write Enable (LWEL) signals 112 (FIG. 1) & 206 (FIG. 2) are used to turn OFF the columns (when the memory contains more than one column per bit). This is to avoid writing into the columns which are not active since the global Write Wordline (WWL) 104 (FIG. 1) & 208 (FIG. 2) is active. It can be seen that since the 9-T and 12-T cell architectures utilize either 9 or 12 transistors, the core cell size turns out to be very large. Moreover, the low voltage margin may still be a problem depending on the process used (for example, if the process is skewed in such a way that it makes the forward inverter p-channel stronger than desired so that writing high (i.e., "1") becomes more difficult). Process tolerances may also lead to differences in transistor sizes leading to difficulty in writing "1" into the cell.

SUMMARY OF THE INVENTION

Accordingly, the present invention is directed to an architecture for a low power, high density (smaller area) asynchronous memory employing a double ended write into the core memory cells. In an exemplary embodiment, the memory cell includes a forward inverter and a feedback inverter disposed in a back-to-back arrangement (i.e., back-to-back inverters). The memory cell further includes two write access transistors, a read inverter, and a read access transistor. Write Bit Lines coupled to write access transistors are precharged to Vdd−Vtn, or, alternately Vdd, when the signal Write Enable (WE) is low (i.e., "0"). When the signal Write Enable (WE) goes high, the Write Bit Lines of columns within the memory that are not being accessed may be left floating so that they may perform an unintended read. However, there are no unintended writes into the cell. On columns where writes are performed, the Write Bit Lines are driven to Vdd or Vss. Accordingly, the Local Write Enable (LWEL) signal and three (3) transistors of conventional 12-T memory cells such as memory cell 200 shown in FIG. 2 are eliminated by the present invention thereby providing higher bit density.

It is to be understood that both the foregoing general description and the following detailed description are exemplary and explanatory only and are not restrictive of the invention as claimed. The accompanying drawings, which are incorporated in and constitute a part of the specification, illustrate presently preferred embodiments of the invention, and together with the general description given above and the detailed description of the preferred embodiments given below, serve to explain the principles of the invention.

BRIEF DESCRIPTION OF THE DRAWINGS

The detailed description of the invention may be best understood when read in reference to the accompanying drawings wherein.

DETAILED DESCRIPTION OF THE INVENTION

Reference will now be made in detail to the presently preferred embodiments of the invention, an examples of which are illustrated in the accompanying drawings.

Figure 2:
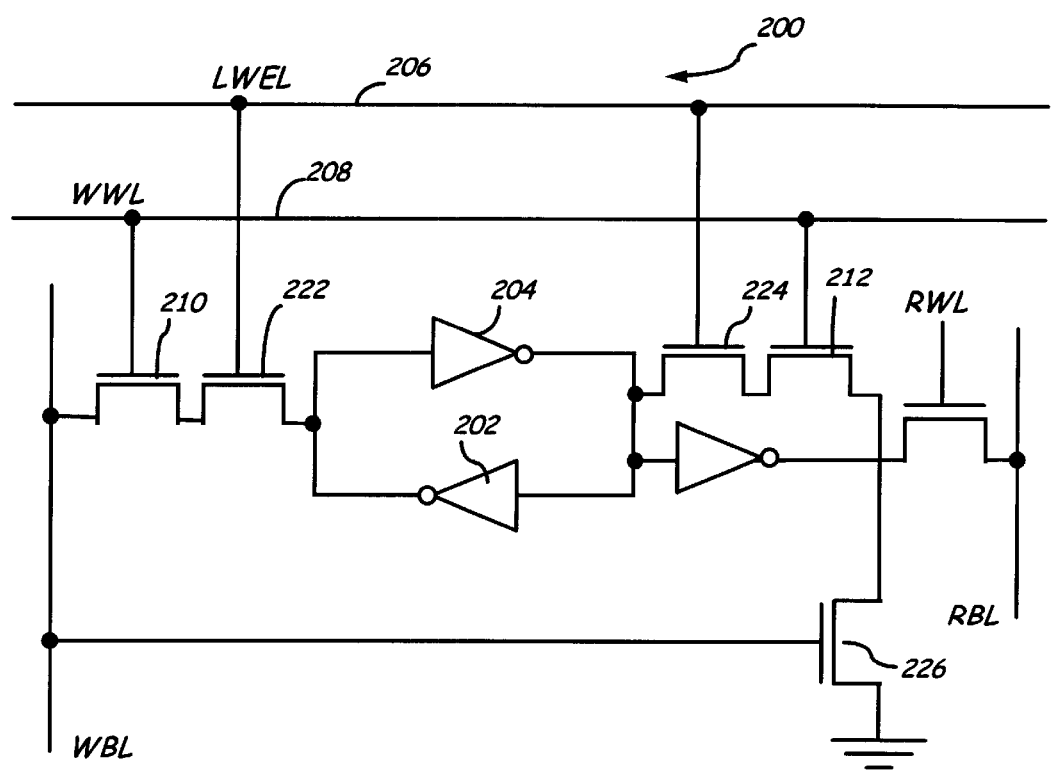
FIG. 2 is a circuit diagram illustrating an twelve transistor (12-T) asynchronous dual-port memory cell.
Figure 3:
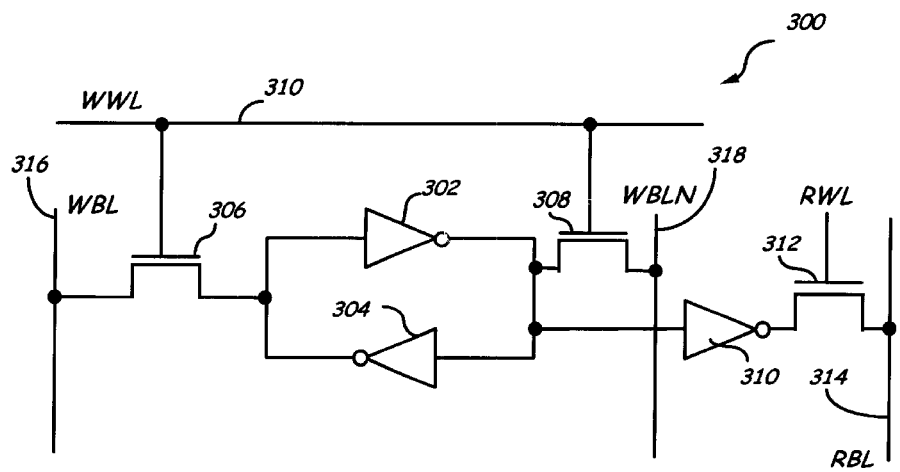
FIG. 3 is a circuit diagram illustrating a nine transistor (9-T) asynchronous dual-port memory cell in accordance with an exemplary embodiment of the present invention.

FIG. 3 illustrates a nine transistor (9-T) asynchronous dual-port memory cell 300 employing an architecture in accordance with an exemplary embodiment of the present invention. The memory cell 300 includes a forward inverter 302 and a feedback inverter 304 disposed in a back-to-back arrangement (i.e., back-to-back inverters). In exemplary embodiments, each inverter 302 & 304 is comprised of two transistors. The memory cell 300 further includes two write access transistors 306 & 308, a read inverter 310, and a read access transistor 312. As shown in FIG. 3, the memory cell 300 employs a real double ended write into the cell 300 and a single ended read from the cell 300. In this manner, the back-to-back inverters 302 & 304 may be sized equally (i.e., so as to be substantially equal in size) instead of being skewed so that the feedback inverter is slightly weaker and the forward inverter is stronger as in memory cells 100 & 200 illustrated in FIGS. 1 and 2, respectively. Further, because the inverters 302 & 304 do not drive any Read Bit Lines (RBL) 314 during a read, they need only be made sufficiently large to hold data. Accordingly, the back-to-back inverters 302 & 304 may be made very small in comparison to corresponding inverters of prior asynchronous memory cells (e.g., memory cells 100 & 200 of FIGS. 1 and 2).

In accordance with the present invention, Write Bit Lines "WBL" 316 and "WBLN" 318 are precharged to Vdd−Vtn, or, alternately Vdd, when the signal Write Enable (WE) (see FIGS. 4B and 5) is low (i.e., "0"). When the signal Write Enable (WE) goes high, the Write Bit Lines WBL 314 & WBLN 316 of columns within the memory that are not being accessed may be left floating so that they may perform an unintended read. However, there are no unintended writes into the cell 100. On columns where writes are performed, the Write Bit Lines WBL 316 and WBLN 318 are driven to Vdd or Vss. Accordingly, the Local Write Enable (LWEL) signal 220 and three (3) transistors 222, 224 & 226 of conventional 12-T memory cells such as memory cell 200 shown in FIG. 2 are eliminated by the present invention.

As shown in FIG. 3, the exemplary memory cell 300 includes nine (9) transistors and is thus a 9-T cell. However, because back-to-back inverters 302 & 304 and write access transistors 306 & 308 may be made very small, the total core cell size may be made substantially smaller than conventional 9-T memory cells such as memory cell 100 illustrated in FIG. 1 while providing improved writability (e.g., a more stable write of "1" and "0" into the memory cell 100). Further, because the memory cell is small, it will experience smaller parasitics resulting in better performance.

Figure 1:
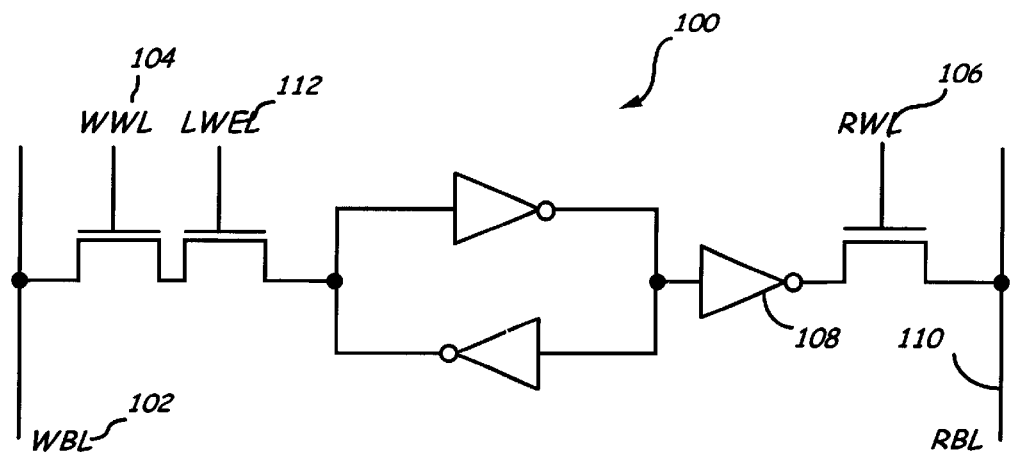
FIG. 1 is a circuit diagram illustrating a nine transistor (9-T) asynchronous dual-port memory cell.

The total power consumption of the memory cell 300 is reduced compared to prior art asynchronous memory cells such as memory cells 100 & 200 of FIGS. 1 and 2. This is because in memory cell 100, one write bit line, e.g., Write Bit Line WBL 316 or WBLN 318, is being driven low and the other is being driven high. Thus, each Write bit line WBL 316 and WBLN 318 will see only the diffusion capacitance of the corresponding write-access transistor 306 or 308. In contrast, the total Write Bit line (WBL) capacitance being driven in prior asynchronous memory cells such as memory cell 200 (FIG. 2) is the diffusion capacitance of both write-access transistors 210 & 212 and the gate capacitance of the transistor 226 utilized for driving the other side of the back-to-back inverters 202 & 204 low. It is contemplated that the diffusion capacitance of memory cell 300 will be approximately half of the memory cell 200 while having equal drive since it has one less n-channel transistor in series. Further, prior memory cells such a memory cell 200 (FIG. 2) always have one Local Write Enable (LWEL) signal 206 driven high consuming a substantial amount of power. As shown in FIG. 3, the Local Write Enable (LWEL) signal 206 is eliminated in memory cell 300.

Figure 4A:
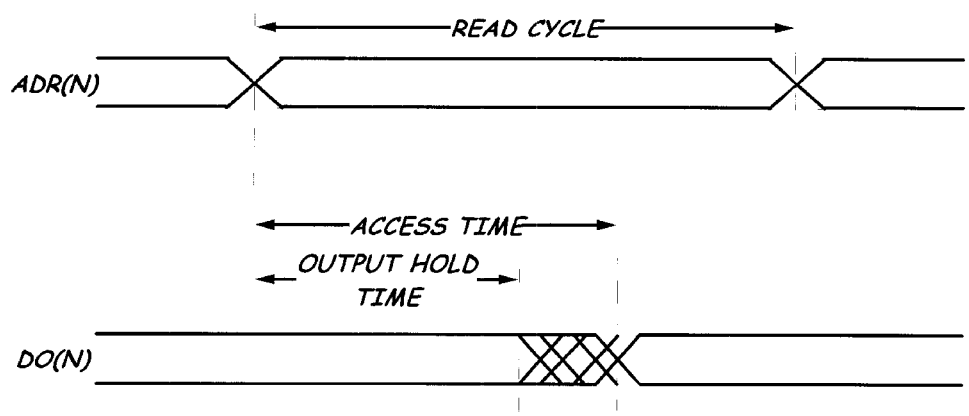
FIG. 4A is a read cycle diagram for the nine transistor (9-T) asynchronous dual-port memory cell shown in FIG. 3.
Figure 4B:
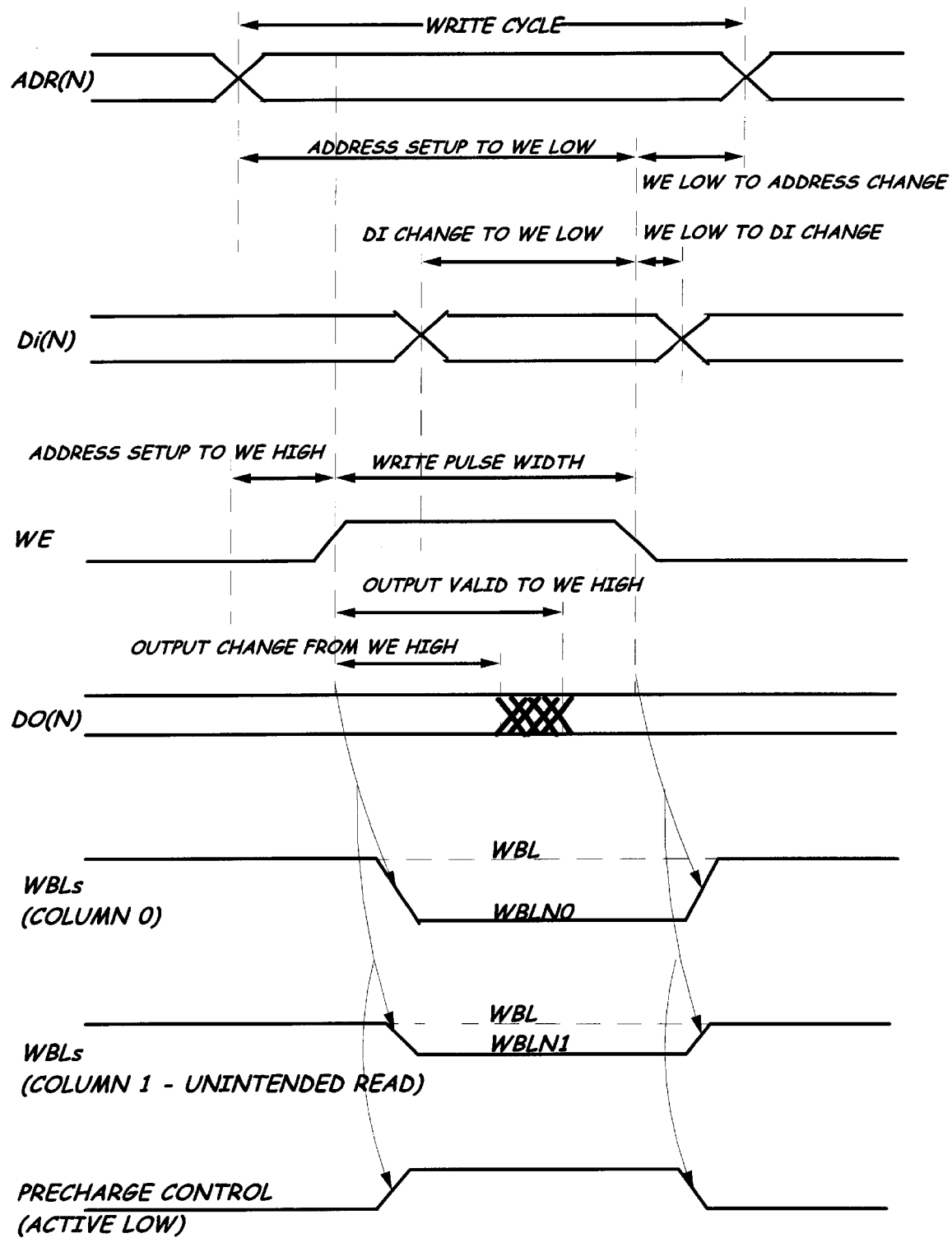
FIG. 4B is a write cycle diagram for the nine transistor (9-T) asynchronous dual-port memory cell shown in FIG. 3 illustrating various inputs of the memory cell.

FIGS. 4A and 4B illustrate waveforms for inputs and outputs of an asynchronous memory utilizing nine transistor (9-T) asynchronous dual-port memory cells 300 shown in FIG. 3. Wave forms are shown for a 2:1 column memory during a read cycle (FIG. 4A) and a write Cycle (FIG. 4B). FIG. 4B also illustrates internal signals (Write Bit Lines (WBLs) etc.) for the memory during the write cycle. However, it will be appreciated that memory cells in accordance with the present invention may be implemented for asynchronous memories any number of columns. Further, memory cells may be implemented in asynchronous memories utilizing any type of column multiplexers. However, if only a 1:1 column multiplex option is utilized, it will be appreciated that there would be no extra column for an unintended read.

Figure 5:
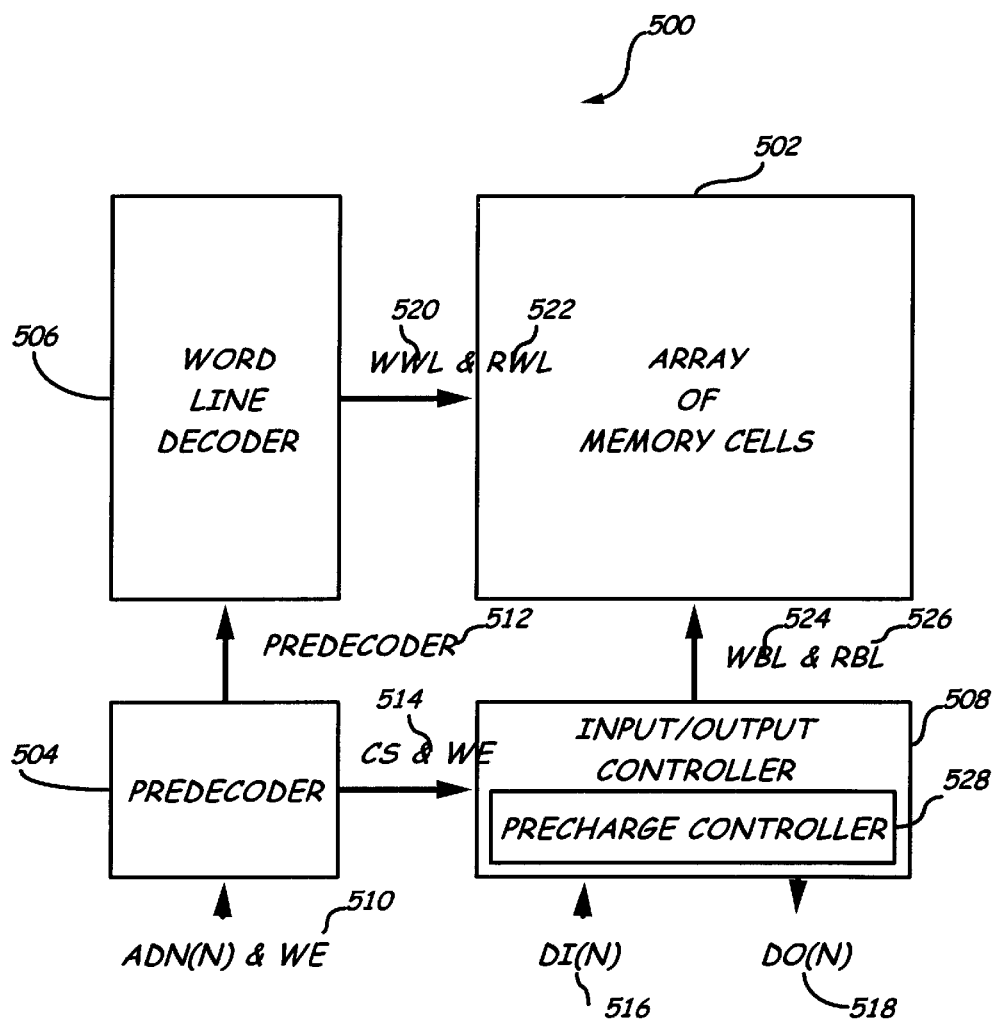
FIG. 5 is a block diagram illustrating an asynchronous memory in accordance with an exemplary embodiment of the present invention.

FIG. 5 illustrates an exemplary asynchronous memory employing memory cells in accordance with the present invention. The asynchronous memory 500 is comprised of an array of memory cells 502 in accordance with the present invention, an exemplary embodiment of which is described herein in the discussion of FIGS. 3, 4A and 4B. Writing of data to and reading of data from the memory cell array 502 is managed by circuitry including a Predecoder 504, a Word Line Decoder 506, and Input/Output Controller or circuit 508. Predecoder 506 receives Address (ADR (N)) and Write Enable (WE) signals 510 and provides Predecoder signals 512 to Word Line Decoder 506 and Column Select (CS) and Write Enable (WE) signals 514 to Input/Output Controller 508. Input/Output Circuit 508 further receives signal Data In (DI(N)) 516 and generates signal Data Out (DO(N)) 518. Word Line Decoder 504 and Input/Output Controller 508 in turn control reading and writing of data in memory cell array 502 via Write Word Lines (WWL) 520 and Read Word Lines (RWL) 522, and Write Bit Lines (WBL) 524 and Read Bit Lines (RBL) 526, respectively. In accordance with the present invention, Input/Output Controller 508 includes a Precharge Controller 528 for precharging Write Bit Lines (WBL) 524 to Vdd–Vtn, or, alternately Vdd, when the signal Write Enable (WE) is low (see FIG. 4B).

It is believed that the of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A memory cell for an asynchronous memory, comprising:

a forward inverter;

a feedback inverter connected in parallel with the forward inverter so that the forward inverter and a feedback inverter are disposed in a back-to-back arrangement;

a first write access transistor for coupling the forward inverter and feedback inverter to a write bit line; and a second write access transistor for coupling the forward inverter and feedback inverter to a second write bit line, wherein the first and second write access transistors are further coupled to a write word line providing a double ended write into the memory cell and the write bit lines are precharged to one of Vdd–Vtn and Vdd when a write enable signal received by the asynchronous memory is low.

2. The memory cell as claimed in claim 1, wherein when the write enable signal goes high, the write bit lines are left floating so that they may perform an unintended read if the memory cell is not being accessed.

3. The memory cell as claimed in claim 1, wherein on columns of the asynchronous memory where writes are performed, the write bit lines are driven to one of Vdd and Vss.

4. The memory cell as claimed in claim 1, further comprising a read inverter, and a read access transistor for providing a single ended read from the memory cell.

5. The memory cell as claimed in claim 1, wherein the forward inverter and the feedback inverter are approximately equal in size.

6. The memory cell as claimed in claim 1, wherein the forward inverter and the feedback inverter are sized so as to be sufficiently large to hold data.

7. A memory cell for an asynchronous memory, comprising:

a forward inverter;

a feedback inverter connected in parallel with the forward inverter so that the forward inverter and feedback inverter are disposed in a back-to-back arrangement;

a first write access transistor for coupling the forward inverter and feedback inverter to a write bit line;

a second write access transistor for coupling the forward inverter and feedback inverter to a second write bit line; and means for providing a double ended write into the memory cell, wherein write bit lines are precharged to one of Vdd−Vtn and Vdd when a write enable signal received by the asynchronous memory is low.

8. The memory cell as claimed in claim 7, wherein when the write enable signal goes high, the write bit lines are left floating so that they may perform an unintended read if the memory cell is not being accessed.

9. The memory cell as claimed in claim 7, wherein on columns of the asynchronous memory where writes are performed, the write bit lines are driven to one of Vdd and Vss.

10. The memory cell as claimed in claim 7, further comprising a read inverter, and a read access transistor for providing a single ended read from the memory cell.

11. The memory cell as claimed in claim 7, wherein the forward inverter and the feedback inverter are approximately equal in size.

12. The memory cell as claimed in claim 7, wherein the forward inverter and the feedback inverter are sized so as to be sufficiently large to hold data.

13. An asynchronous memory, comprising an array of memory cells, at least one memory cell in the array including;

a forward inverter;

a feedback inverter connected in parallel with the forward inverter so that the forward inverter and feedback inverter arc disposed in a back-to-back arrangement;

a first write access transistor for coupling the forward inverter and feedback inverter to a write bit line; and a second write access transistor for coupling the forward inverter and feedback inverter to a second write bit line; and a word line decoder;

an input and output assembly; and a predecoder coupled to the word line decoder and input and output assembly, wherein the first and second write access transistors are coupled to a write word line providing a double ended write into the memory cell.

14. The asynchronous memory as claimed in claim 13, further comprising a precharge controller for precharging the write bit lines to Vdd−Vtn when a write enable signal received by the asynchronous memory is low.

15. The asynchronous memory as claimed in claim 14, wherein when the write enable signal goes high, the write bit lines are left floating so that they may perform an unintended read if the memory cell is not being accessed.

16. The asynchronous memory as claimed in claim 13, further comprising a precharge controller for precharging the write bit lines to Vdd when a write enable signal received by the asynchronous memory is low.

17. The asynchronous memory as claimed in claim 16, wherein when the write enable signal goes high, the write bit lines are left floating so that they may perform an unintended read if the memory cell is not being accessed.

18. The asynchronous memory as claimed in claim 13, wherein on columns of the asynchronous memory where writes are performed, the write bit lines are driven to one of Vdd and Vss.

19. The asynchronous memory as claimed in claim 13, wherein the at least one memory cell further comprises a read inverter, and a read access transistor for providing a single ended read from the memory cell.

20. The asynchronous memory as claimed in claim 13, wherein the forward inverter and the feedback inverter are approximately equal in size.

21. The asynchronous memory as claimed in claim 13, wherein the forward inverter and the feedback inverter are sized so as to be sufficiently large to hold data.

22. A memory cell for an asynchronous memory, comprising:

a forward inverter;

a feedback inverter connected in parallel with the forward inverter so that the forward inverter and feedback inverter are disposed in a back-to-back arrangement;

a first write access transistor for coupling the forward inverter and feedback inverter to a write bit line; and a second write access transistor for coupling the forward inverter and feedback inverter to a second write bit line;

a read inverter; and a read access transistor, the read inverter and read access transistor for providing a single ended read from the memory cell, wherein the first and second write access transistors are further coupled to a write word line providing a double ended write into the memory cell.

23. The memory cell as claimed in claim 22, wherein the write bit lines are precharged to one of Vdd−Vtn and Vdd when a write enable signal received by the asynchronous memory is low.

24. The memory cell as claimed in claim 23, wherein when the write enable signal goes high, the write bit lines are left floating so that they may perform an unintended read if the memory cell is not being accessed.

25. The memory cell as claimed in claim 22, wherein on columns of the asynchronous memory where writes arm performed, the write bit lines are driven to one of Vdd and Vss.

26. The memory cell as claimed in claim 22, further comprising a read inverter and a read access transistor for providing a single ended read from the memory cell.

27. The memory cell as claimed in claim 22, wherein the forward inverter and the feedback inverter are approximately equal in size.

28. The memory cell as claimed in claim 22, wherein the forward inverter and the feedback inverter are sized so as to be sufficiently large to hold data.

29. A memory cell for an asynchronous memory, comprising:

a forward inverter;

a feedback inverter connected in parallel with the forward inverter so that the forward inverter and feedback inverter are disposed in a back-to-back arrangement;

a first write access transistor for coupling the forward inverter and feedback inverter to a write bit line;

a second write access transistor for coupling the forward inverter and feedback inverter to a second write bit line;

a read access transistor, the read inverter and read access transistor for providing a single ended read from the memory cell; and means for providing a double ended write into the memory cell.

30. The memory cell as claimed in claim 29, wherein the write bit lines are precharged to one of Vdd−Vtn and Vdd when a write enable signal received by the asynchronous memory is low.

31. The memory cell as claimed in claim 30, wherein when the write enable signal goes high, the write bit lines are left floating so that they may perform an unintended read if the memory cell is not being accessed.

32. The memory cell as claimed in claim 29, wherein on columns of the asynchronous memory where writes are performed, the write bit lies are driven to one of Vdd and Vss.

33. The memory cell as claimed in claim 29, wherein the forward inverter and the feedback inverter are approximately equal in size.

34. The memory cell as claimed in claim 29, wherein the forward inverter and the feedback inverter are sized so as to be sufficiently large to hold data.

35. An asynchronous memory, comprising
   an array of memory cells, at least one memory cell in the array including;
      a forward inverter;
         a feedback inverter connected in parallel with the forward inverter so that the forward inverter and feedback inverter are disposed in a back-to-back arrangement;
         a first write access transistor for coupling the forward inverter and feedback inverter to a write bit line; and
         a second write access transistor for coupling the forward inverter and feedback inverter to a second write bit line; and
   a precharge controller for precharging the write bit lines to one of Vdd–Vtn and Vdd when a write enable signal received by the asynchronous memory is low,
   wherein the first and second write access transistors are coupled to a write word line providing a double ended write into the memory cell.

36. The asynchronous memory as claimed in claim 35, further comprising:
   a word line decoder;
   an input and output assembly; and
   a predecoder coupled to the word line decoder and input and output assembly.

37. The asynchronous memory as claimed in claim 35, wherein when the write enable signal goes high, the write bit lines are left floating so that they may perform an unintended read if the memory cell is not being accessed.

38. The asynchronous memory as claimed in claim 35, wherein on columns of the asynchronous memory where writes arc performed, the write bit lines arc driven to one of Vdd and Vss.

39. The asynchronous memory as claimed in claim 35, wherein the at least one memory cell further comprises a read inverter, and a read access transistor for providing a single ended read from the memory cell.

40. The asynchronous memory as claimed in claim 35, wherein the forward inverter and the feedback inverter are approximately equal in se.

41. The asynchronous memory as claimed in claim 35, wherein the forward inverter and tile feedback inverter are sized so as to be sufficiently large to hold data.

42. An asynchronous memory, comprising
   an array of memory cells, at least one memory cell in the array including;
      a forward inverter;
      a feedback inverter connected in parallel with the forward inverter so that the forward inverter and feedback inverter are disposed in a back-to-back arrangement;
      a first write access transistor for coupling the forward inverter and feedback inverter to a write bit line; and
      a second write access transistor for coupling the forward inverter and feedback inverter to a second write bit line;
   at least one memory cell in the array further includes a read inverter, and a read access transistor for providing a single ended read from the memory cell,
   wherein the first and second write access transistors are coupled to a write word line providing a double ended write into the memory cell.

43. The asynchronous memory as claimed in claim 42, further comprising:
   a word line decoder;
   an input and output assembly; and
   a predecoder coupled to the word line decoder and input and output assembly.

44. The asynchronous memory as claimed in claim 42, further comprising a precharge controller for precharging the write bit lines to one of Vdd–Vtn and Vdd when a writeenable signal received by the asynchronous me 45. The asynchronous memory as claimed in claim 44, wherein when the write enable signal goes high, the write bit lines are left floating so that they may perform an unintended read if the memory cell is not being accessed.

46. The asynchronous memory as claimed in claim 42, wherein on columns of the asynchronous memory where writes are performed, the write bit lines are driven to one of Vdd and Vss.

47. The asynchronous memory as claimed in claim 42, wherein the forward inverter and the feedback inverter are approximately equal in size.

48. The asynchronous memory as claimed in claim 42, wherein the forward inverter and the feedback inverter are size so as to be sufficiently large to hold data.

* * * * *